United States Patent [19]

Yoon et al.

[11] Patent Number: 5,608,677
[45] Date of Patent: Mar. 4, 1997

[54] BOOSTING VOLTAGE CIRCUIT USED IN ACTIVE CYCLE OF A SEMICONDUCTOR MEMORY DEVICE

[75] Inventors: Sei-Seung Yoon; Chan-Jong Park, both of Seoul; Byung-Chul Kim, Kyungki-do, all of Rep. of Korea

[73] Assignee: Samsung Electronics Co., Ltd., Suwon, Rep. of Korea

[21] Appl. No.: 579,913

[22] Filed: Dec. 28, 1995

[30] Foreign Application Priority Data

Dec. 29, 1994 [KR] Rep. of Korea .................. 38503/1994

[51] Int. Cl.$^6$ ................................................. G11C 7/00
[52] U.S. Cl. ............................. 365/189.09; 365/189.11; 365/194; 365/226
[58] Field of Search .......................... 365/189.09, 189.11, 365/226, 194, 189.12

[56] References Cited

U.S. PATENT DOCUMENTS

5,010,259  4/1991  Inoue et al. ..................... 365/189.11
5,153,855 10/1992  Konishi ............................ 365/189.11
5,247,480  9/1993  Itoh et al. ........................ 365/189.11
5,550,775  8/1996  Abe et al. ........................ 365/189.11

Primary Examiner—David C. Nelms
Assistant Examiner—Son T. Dinh
Attorney, Agent, or Firm—Allen LeRoy Limberg

[57] ABSTRACT

A voltage boosting circuit for a semiconductor memory device has a clock generator for supplying a chip master clock determining an active state and a stand-by state in respective response to first and second states thereof, for generating a detector control signal a first delay time after the first state of the chip master clock is generated, and for generating a latch control signal a second delay time after the first state of the chip master clock is generated. A boosting voltage detector responds to the detector control signal and the latch control signal to generate a detecting signal indicative of a current state of a boosting voltage potential. First and second boosting voltage generators generate the boosting voltage potential, respectively operating in the stand-by state and active state in accordance with the detecting signal and delayed chip master clock signal.

3 Claims, 8 Drawing Sheets (PRIOR ART)
*FIG. 1*

BOOSTING VOLTAGE CIRCUIT USED IN ACTIVE CYCLE OF A SEMICONDUCTOR MEMORY DEVICE

BACKGROUND OF THE INVENTION

The present invention relates to a high integrated semiconductor memory device using a low level of power supply voltage, and more particularly to a boosting voltage circuit which is capable of detecting the boosting voltage level in such a device.

Recently, as dynamic random access memory (dynamic RAM) design tends toward higher density and lower power consumption, a boosting voltage Vpp generator is often employed in a chip so as to prevent the deterioration of, for example, word line driving capability. This boosting voltage Vpp has a higher voltage level than an internally used power supply voltage Vcc and serves to raise a word line driving voltage attenuated because of the high density of the device. To read data "1" stored in memory cells, a sufficient voltage difference should be formed in distributing a charge between the memory cells and bit lines. To this end, a sufficient level of voltage has to be supplied to the word line so that cell transistors can be fully turned on. However, since this effect cannot be obtained with a lowered power supply voltage Vcc, such a boosting voltage Vpp having more than a potential of Vcc+Vth (where Vth is a threshold voltage of the cell transistor) becomes necessary.

As well known in the related art, methods of maintaining the potential of the boosting voltage Vpp are as follows. In a stand-by state, the Vpp level is detected through a level detector for stand-by. Whenever the detected level is lower than a predetermined reference level, a boosting voltage generator for stand-by is driven to raise the detected level to the reference level. Whenever the detected level is higher than or equal to the reference level, an operation of the boosting voltage generator for stand-by is stopped. However, since a typical boosting voltage generator for stand-by has a small capacity, another boosting voltage generator for active cycle having a great large capacity is further needed so as to supplement a charge amount of the boosting voltage consumed during the active cycle.

Figure 1:
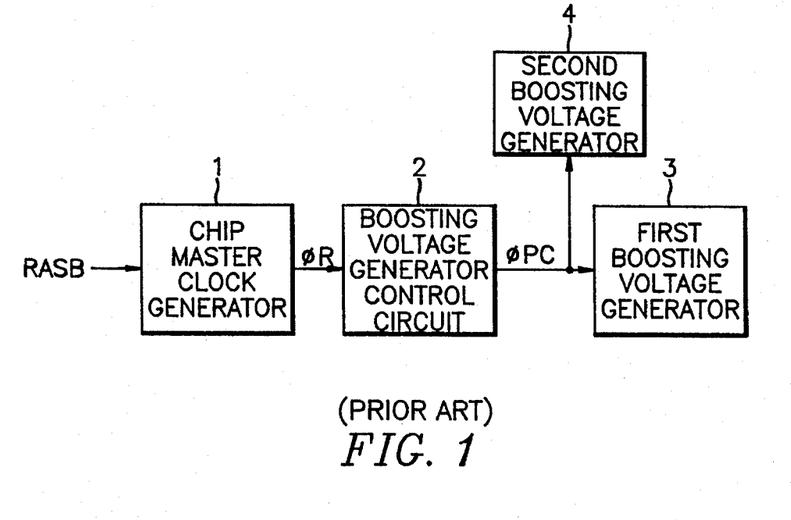
FIG. 1 is a schematic block diagram of a conventional voltage boosting circuit.
Figure 2:
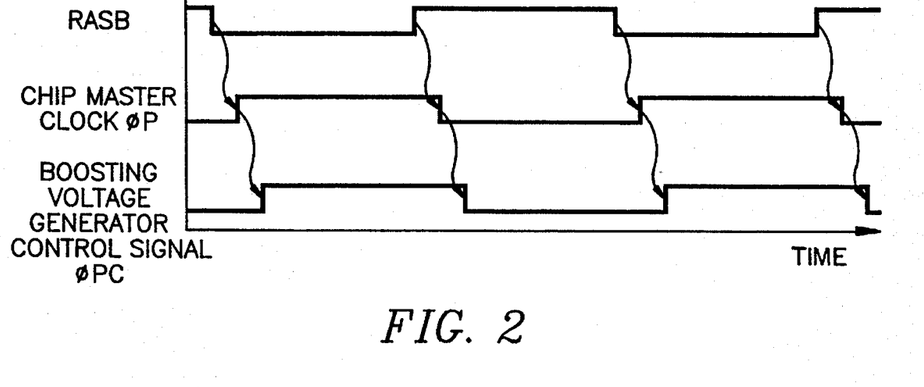
FIG. 2 is a timing diagram of the FIG. 1 voltage boosting circuit.
Figure 3:
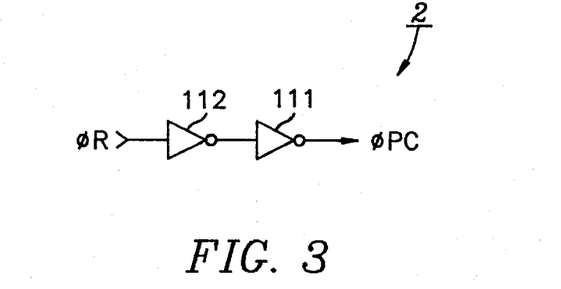
FIG. 3 is a circuit diagram of the boosting voltage generator control circuit 2 of FIG. 1.
Figure 4:
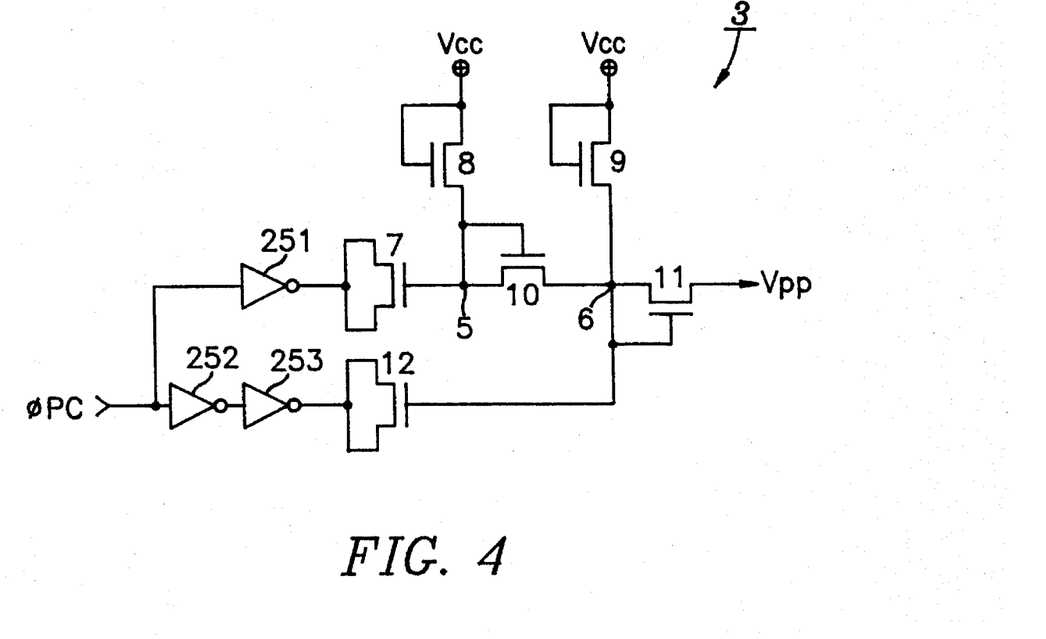
FIG. 4 is a circuit diagram of the first boosting voltage generator 3 of FIG. 1.

FIG. 1 shows a conventional voltage boosting circuit configuration. A chip master clock generator 1 chip generates a master clock φR in response to a row address strobe signal RASB. A boosting voltage generator control circuit 2 generates a boosting voltage generator control signal φPC every active cycle in response to the chip master clock φR. First and second boosting voltage generators 3 and 4, which are respectively used for stand-by cycle and active cycle, are selectively operated under control of the signal φPC. As shown in FIGS. 2 to 5, the first and second boosting voltage generators 3 and 4 are operated in a complementary relation in accordance with the signal φPC. In the active cycle where the signal RASB is in a logic "low" level, the first boosting voltage generator 3 generates the boosting voltage Vpp, and in the stand-by cycle where the signal RASB is in a logic "high" level, the second boosting voltage generator 4 generates the boosting voltage Vpp. Referring to FIG. 4, during the stand-by cycle where the signal φPC is in the logic "low" level, a potential on a node 5 is raised by a MOS capacitor 7, and the raised potential is transmitted through a diode-connected NMOS transistor 10 for transmission to a node 6. When the signal φPC is changed from the logic "low" level to the logic "high" level (the signal RASB falls to the logic "low" level and the active cycle is started), the potential on the node 6 is again boosted by a MOS capacitor 12 and generated as the boosting voltage Vpp through a diode-connected NMOS transistor 11.

Here, by accurately detecting the charge amount of the Vpp consumed every active cycle, the capacity of the boosting voltage generator for the active cycle should be set to supply the detected charge amount of the Vpp. However, in the configuration of FIG. 1, there are problems in that the charge consumption amount of the Vpp is not accurately consistent with the capacity of the boosting voltage generator, and in the case where the capacity of the boosting voltage generator is larger than the charge consumption amount of the Vpp, the reliability of chip is deteriorated due to extended current consumption and high electric field.

SUMMARY OF THE INVENTION

It is therefore an object of the invention to provide a boosting voltage circuit which is capable of generating a boosting voltage in accordance with the amount of charge consumption from the boosting voltage during an active cycle, suitable for inclusion in a semiconductor memory device.

In accordance with one aspect of the present invention, a boosting voltage circuit of a semiconductor memory device includes: a A voltage boosting circuit for a semiconductor memory device comprising:

first circuit means for supplying a chip master clock determining an active cycle and a stand-by cycle in respective response to first and second states thereof, for generating a detector control signal a first delay time after the first state of said chip master clock is generated, and for generating a latch control signal a second delay time after the first state of said chip master clock is generated, said detector control signal having a first pulse width and said latch control signal having a second pulse width;

second circuit means for responding to said detector control signal and said latch control signal and generating a detecting signal indicative of a current state of a boosting voltage potential;

third circuit means for generating a boosting voltage generator control signal activated in response to said chip master clock and timed to occur sinmltaneously with said detecting signal; and first and second boosting voltage generating means for respectively operating in said stand-by cycle and said active cycle in accordance with said detecting signal and said boosting voltage generator control signal.

In accordance with another aspect of the present invention, a boosting voltage circuit of a semiconductor memory device includes:

first circuit means for supplying a chip master clock determining an active cycle and a stand-by cycle in respective response to first and second states thereof, for generating a detector control signal a first delay time after the first state of said chip master clock is generated, and for generating a latch control signal a second delay time after the first state of said chip master clock is generated, said detector control signal having a first pulse width and said latch control signal having a second pulse width;

second circuit means for responding to said detector control signal and said latch control signal and generating a first detecting signal indicative of a current state of a boosting voltage potential;

third circuit means responsive to said first detecting signal and generating a second detecting signal in accordance with the control of said chip master clock;

fourth circuit means for generating a boosting voltage generator control signal activated in response to said chip master clock and timed to occur simultaneously with said second detecting signal; and first and second boosting voltage generating means for respectively operating in said stand-by cycle and said active cycle in accordance with said detecting signal and said boosting voltage generator control signal.

BRIEF DESCRIPTION OF THE DRAWINGS

The advantages and features of the present invention will be more apparent from the detailed description that follows, with reference to the attached drawings, in which.

DETAILED DESCRIPTION OF THE PREFERRED EMBODIMENT

Figure 6:
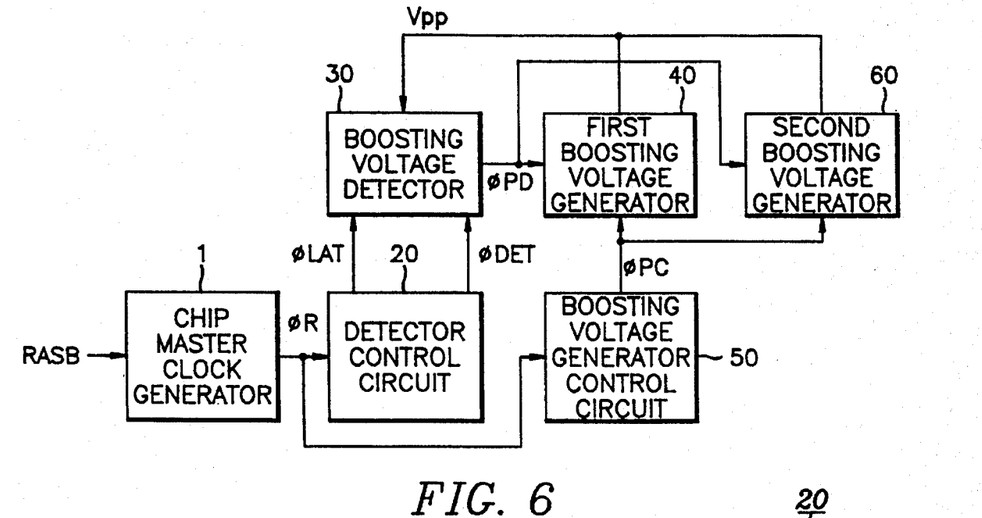
FIG. 6 is a schematic block diagram of a voltage boosting circuit. embodying the present invention.

Referring to FIG. 6, a voltage boosting circuit embodying the present invention comprises a chip master clock generator 1 for generating a chip master clock $\phi R$ in response to a row address strobe signal RASB; a detector control circuit 20 for generating a detector control signal $\phi DET$ and a latch control signal $\phi LAT$ in response to the chip master clock $\phi R$; a boosting voltage generator control circuit 50 for generating a boosting voltage generator control signal $\phi PC$ in response to the chip master clock $\phi R$; first and second boosting voltage generators 40 and 60 for generating boosting voltages Vpp under the control of the boosting voltage generator control signal $\phi PC$; and a boosting voltage detector 30 for supplying to the first and second boosting voltage generators 40 and 60 a signal $\phi PD$ sensing the boosting potential Vpp in accordance with the control of the signals $\phi DET$ and $\phi LAT$.

If the boosting voltage detector 30 senses that the boosting potential Vpp is lower than prescribed value, the signal $\phi PD$ supplied to the first boosting voltage generator 40 and to the second boosting voltage generator 60 is at a logic "high" level which enables them for pumping up the boosting voltage Vpp to higher level. In the active cycle where the signal RASB is in a logic "low" level, the first boosting voltage generator 40 generates the boosting voltage Vpp, and in the stand-by cycle where the signal RASB is in a logic "high" level, the second boosting voltage generator 60 generates the boosting voltage Vpp.

If the boosting voltage detector 30 senses that the boosting potential Vpp is at least prescribed value, the signal $\phi PD$ supplied to the first boosting voltage generator 40 and to the second boosting voltage generator 60 is at a logic "low" level which postpones their being enabled for pumping up the boosting voltage Vpp to higher level, the postponement being at least until after the beginning of the next active cycle.

Figure 7:
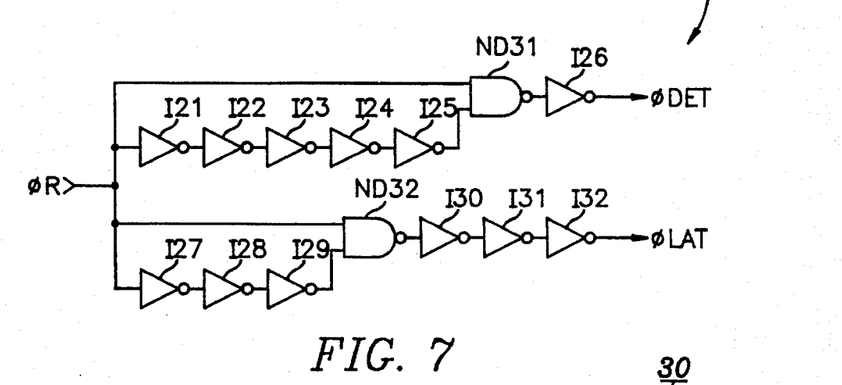
FIG. 7 is a circuit diagram of the detector control circuit 20 of FIG. 6.

Referring to FIG. 7, in the detector control circuit 20 of FIG. 6, the signal $\phi DET$ is generated in the configuration having a pulse shaping circuit including a NAND gate ND31, one input terminal of which has the chip master clock $\phi R$ applied directly thereto and another input terminal of which receives the chip master clock $\phi R$ as complemented and delayed in a cascade connection of inverters I21 to I25, and an inverter I26 for supplying the signal $\phi DET$ as a complemented response to the output of the pulse shaping circuit. In the meanwhile, the signal $\phi bLAT$ is generated in the configuration having a pulse shaping circuit including a NAND gate ND32, one input terminal of which has the chip master clock $\phi R$ applied directly thereto and another input terminal of which receives the chip master clock $\phi R$ as complemented and delayed in a cascade connection of inverters I27 to I29, and inverters I30 to I32 for supplying the signal $\phi LAT$ as a complemented and delayed response to the pulse shaping circuit.

Figure 8:
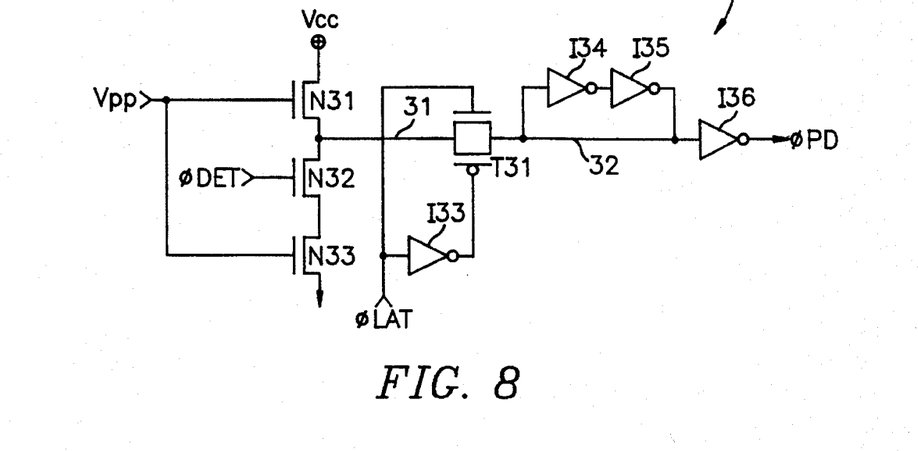
FIG. 8 is a circuit diagram of the boosting voltage detector 30 of FIG. 6.

Referring to FIG. 8 showing the boosting voltage detector 30 of FIG. 6, the boosting voltage Vpp is applied to the gate of an NMOS transistor N31 having its channel connected between a power supply voltage Vcc and a detecting node 31. The detector control signal $\phi DET$ is applied to the gate of an NMOS transistor N32 having its channel connected between the detecting node 31 and the drain of an NMOS transistor N33 having the boosting voltage Vpp applied to its gate and having its source connected to ground Vss. The detecting node 31 is connected to an input terminal of a CMOS transmission gate T31. The signal $\phi LAT$ is applied to the gate of the NMOS transistor in the transmission gate T31 and is complemented by an inverter I33 for application to the gate of the PMOS transistor in the transmission gate T31. There is a direct path 32 from the output terminal of the transmission gate T31 to the input of an inverter I36 generating as its response a signal $\phi PD$ detecting the potential of the boosting voltage Vpp. The direct path 32 is also from the output of a cascade connection of inverters I34 and I35 to its input connection, which direct path 32 provides a regenerative feedback connection conditioning the inverters I34 and I35 to function as a latch for the φPD signal when the transmission gate T31 is no longer conductive.

Figure 9:
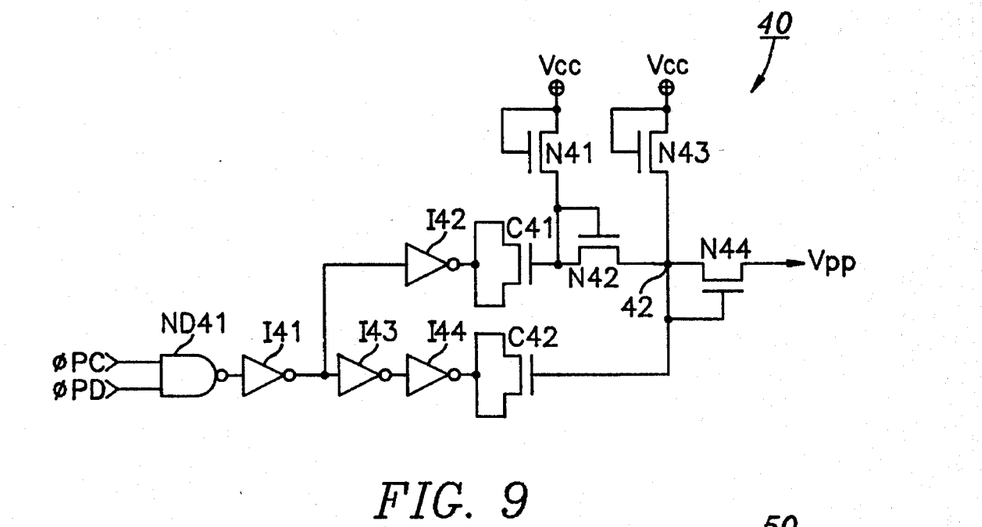
FIG. 9 is a circuit diagram of the first boosting voltage generator 40 of FIG. 6.

Referring to FIG. 9 showing the first boosting voltage generator 40 of FIG. 6, the first boosting voltage generator 40 has a configuration similar to that of the first boosting voltage generator 3 of FIG. 4 except for including a NAND gate ND41 and an inverter I41 for complementing the response of the NAND gate ND41, which NAND gate ND41 and inverter I41 provide AND gate response to the signals φPC and φPD applied as inputs to the NAND gate ND41.

Figure 10:
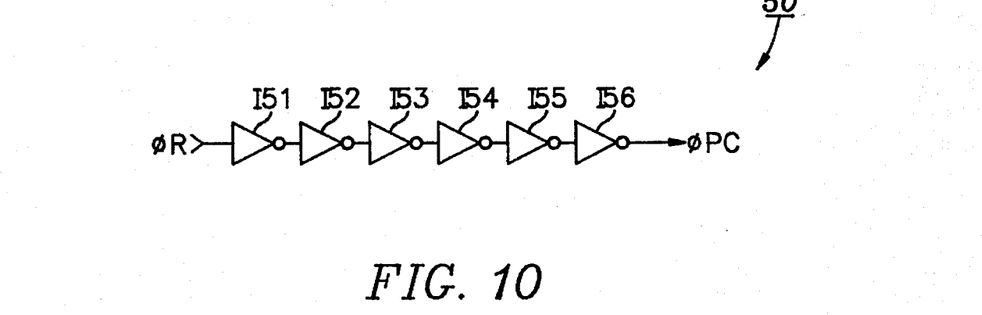
FIG. 10 is a circuit diagram of the boosting voltage generator control circuit 50 of FIG. 6.

Referring to FIG. 10 showing the boosting voltage generator control circuit 50 of FIG. 6, its structure is a cascade connection of an even number of inverters I51 to I56. When compared with the conventional structure of FIG. 3, the increment of the number of inverters is chosen to operate the first and second boosting voltage generators 40 and 60, with suitable delay after the detecting signal φPD is generated in accordance with the potential state of the boosting voltage Vpp detected by the boosting voltage detector 30.

Figure 5:
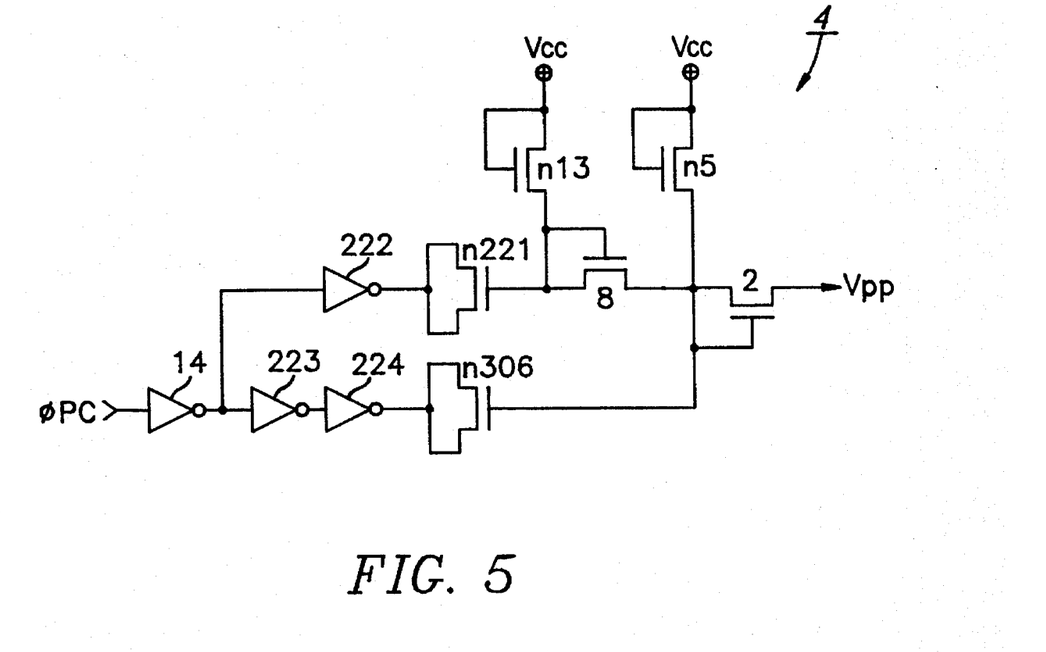
FIG. 5 is a circuit diagram of the second boosting voltage generator of FIG. 1.
Figure 11:
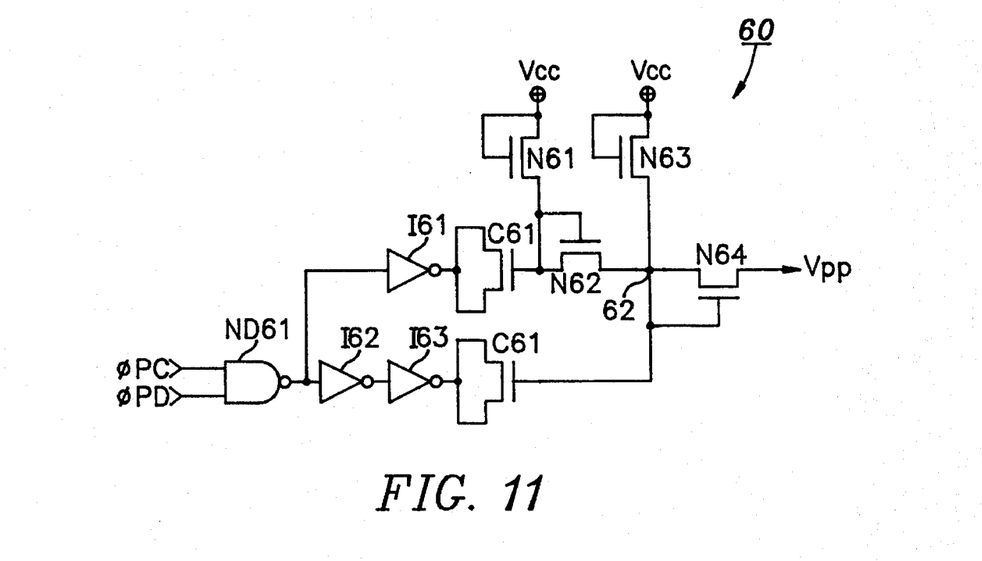
FIG. 11 is a circuit diagram of the second boosting voltage generator 60 of FIG. 6.

Referring to FIG. 11 showing the second boosting voltage generator 60 of FIG. 6, since the second boosting voltage generator 60 operates in a complementary relation with the first boosting voltage generator 40, the generator 60 has the same configuration as the second boosting voltage generator 4 of FIG. 5 except for the inverter 14 of FIG. 5 being replaced by a NAND gate ND61 receptive of the signals φPC and φPD.

Figure 12:
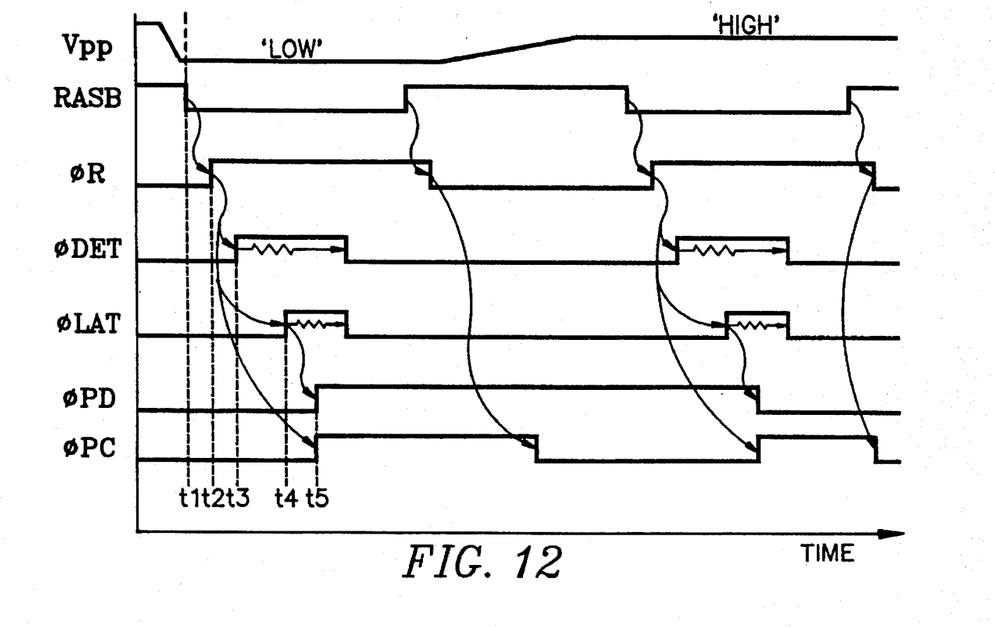
FIG. 12 is a timing diagram of the operation of the FIG. 6 voltage boosting circuit.

Referring to FIG. 12 showing the timing diagram of FIG. 6, the operation characteristic according to the present invention is shown when the boosting voltage Vpp changes from a low potential to a high potential. As the signal RASB is changed to the logic "low" level from the logic "high" level at a time period t1, the signal φR is generated at the logic "high" level at a time period t2 and the signal φDET is generated as a pulse of the logic "high" level at a time period t3. After that, the signal φLAT is generated as a pulse of the logic "high" level at a time period t4. In the meanwhile, the boosting voltage detector 30 of FIG. 8, during a precharge cycle where the signal RASB is in the logic "high" level, since the signals φDET and φLAT are all in the logic "low" level, the potential of the detecting node 31 is precharged to the power supply voltage Vcc by the NMOS transistor N31 and the transmission gate T31 is turned off. If the signal φDET applied to the gate of NMOS transistor N32 becomes a pulse of the logic "high" level at the time period t3, the potential of the detecting node 31 is dependent upon the potential state of the boosting voltage Vpp. When Vpp potential is high, the potential of the detecting node 31 goes to the logic "high" level. When Vpp potential is low, however, the potential of the detecting node 31 falls to the logic "low" level. If the level of the signal φLAT becomes high at the time period t4, the transmission gate T31 is turned on, and the signal φPD is generated at the potential of the detecting node 31 at that time. That is, when Vpp potential is high, the signal φPD is at logic "low" level; or, when Vpp potential is low, the signal φPD is at logic "high" level.

Then, when the level of the signal φLAT becomes low and the transmission gate T31 is turned off, the current status is maintained by the inverters I34 and I35. The generation of the signals φDET and φLAT as the pulses is made to prevent unnecessarily power consumption by the operation of the boosting voltage detector 30 only during the time necessary for detecting Vpp potential in the active cycle.

Referring to FIGS. 9 and 11, the first boosting voltage generator 40 operates in response to the time point when the signal RASB is changed to the logic "low" level from the logic "high" level, and the second boosting voltage generator 60 operates in response to the time point when the signal RASB is changed to the logic "high" level from the logic "low" level. In the case where the boost voltage Vpp has a high potential, since the signal φPD is applied at the logic "low" level, the first and second boosting voltage generators 40 and 60 maintain the non-activation state, and contrarily in the case where the Vpp has a low potential, since the signal φPD is applied at the logic "high" level, the first and second boosting voltage generators 40 and 60 are in turn operated in accordance with the signal RASB and the toggled signal φPC. The operations of the first and second boosting voltage generators 40 and 60 are executed in the same manner as those of FIGS. 4 and 5.

Figure 13:
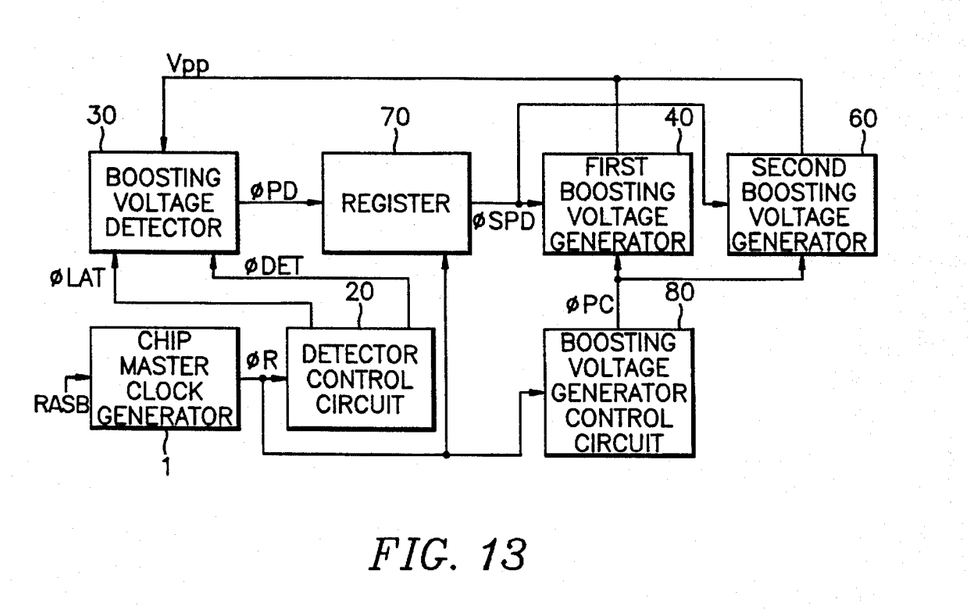
FIG. 13 is a schematic block diagram of a boosting voltage circuit according to another embodiment of the present invention.

FIG. 13 is a schematic block diagram of a boosting voltage circuit according to another embodiment of the present invention. In addition to the structure of FIG. 6, a register 70 is disposed between the boosting voltage detector 30 and the first and second boosting voltage generators 40 and 60. In other words, the signal φPD generated from the boosting voltage detector 30 is delayed by its passage through the register 70 and is then applied to the first and second boosting voltage generators 40 and 60. This permits the boosting voltage control circuit 50 with its long delay to be replaced by a boosting voltage control circuit 80 with appreciably shorter delay.

Figure 14:
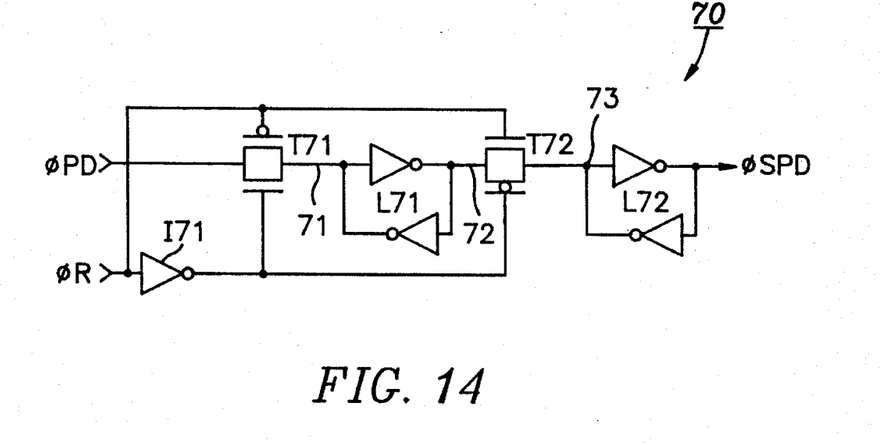
FIG. 14 is a circuit diagram of the register 70 of FIG. 13.

FIG. 14 shows the register 70 to be a shift register comprising transmission gates T71 and T72 controlled by the signal φR and latches L71 and L72. When the signal φR is in the logic "low" level, the transmission gate T71 is turned on and the signal φPD generated from the boosting voltage detector 30 in the previous active cycle is stored in the latch L71. On the other hand, when the signal φR is in the logic "high" level, the transmission gate T72 is turned on and the state temporarily stored in the latch L72 in the previous active cycle is supplied as the signal φSPD. Thereafter, when the signal φR falls to the logic "low" level, the transmission gate T71 is turned on and the transmission gate T72 is turned off, this resulting in the change of storing status of latch L71. That is, the register 70 operates to allow the signal φPD set in the previous active cycle to determine whether the driving of the first and second boosting voltage generators 40 and 60 is executed.

Figure 15:
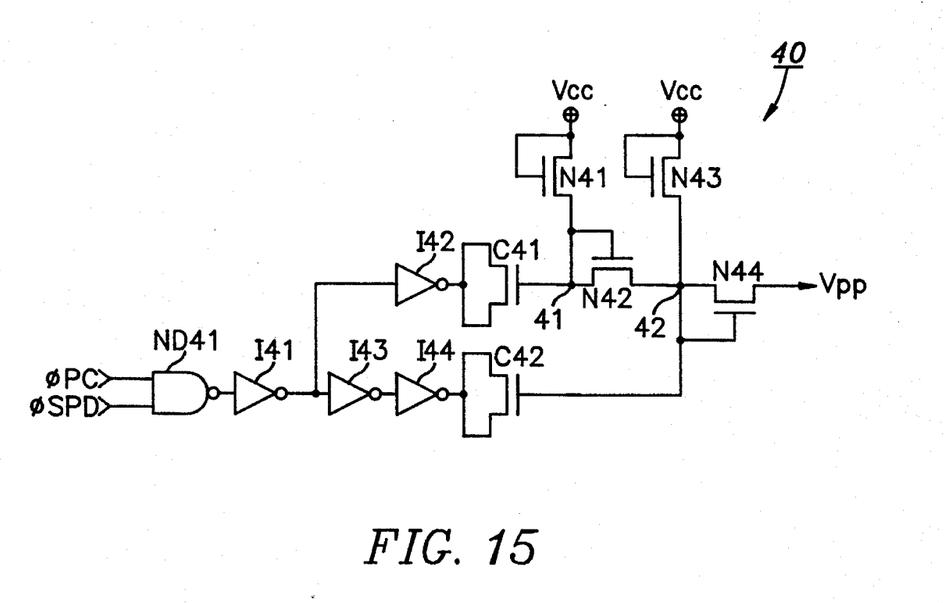
FIG. 15 is a circuit diagram of the first boosting voltage generator 40 of FIG. 13.
Figure 16:
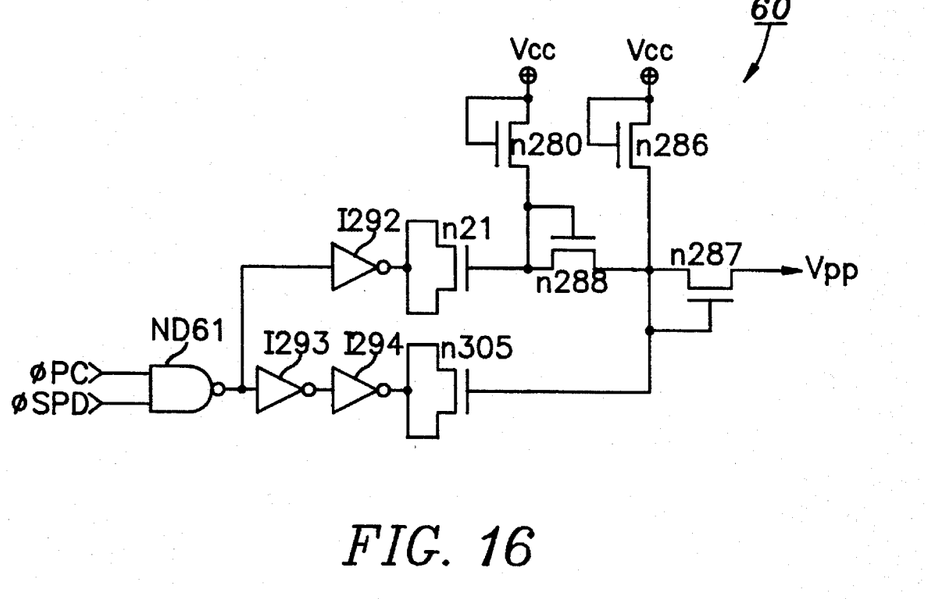
FIG. 16 is a circuit diagram of the second boosting voltage generator 60 of FIG. 13.
Figure 17:
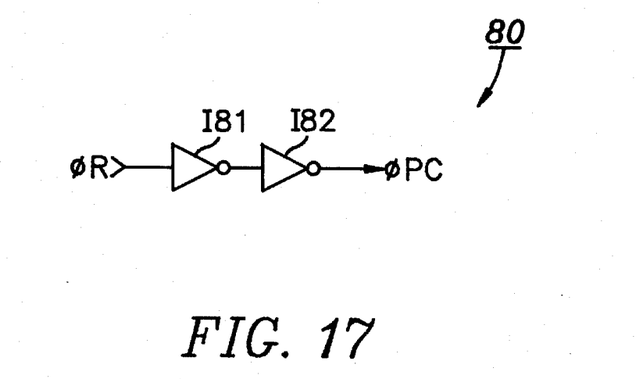
FIG. 17 is a circuit diagram of the boosting voltage generator control circuit 80 of FIG. 13.

Instead of the signal φPD of FIGS. 9 and 11, the signal φSPD is, as shown in FIGS. 15 and 16, supplied to NAND gates ND41 and ND61 of the first and second boosting voltage generators 40 and 60. Furthermore, the boosting voltage generator control circuit 80 in the embodiment of FIG. 13 is constructed not with the six inverters shown in FIG. 6 to meet with the time period during the generation of the signal φPD, but with two serial inverters I81 and I82 shown in FIG. 17. When compared with the structure of FIG. 6, this ensures a sufficient operation time for the boosting voltage generator.

Figure 18:
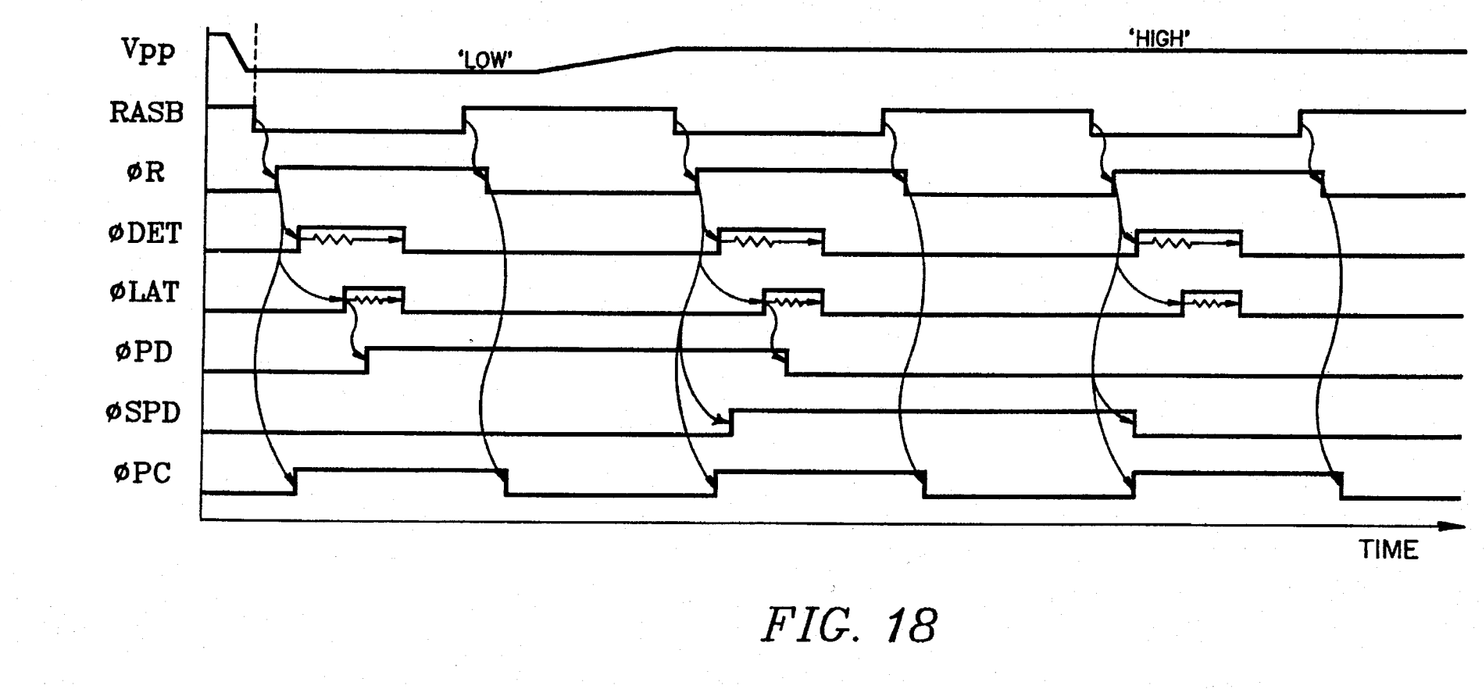
FIG. 18 is a timing diagram of the FIG. 13 voltage boosting circuit.

Referring to FIG. 18 showing a timing diagram of FIG. 13, in the case where the Vpp is low, the boosting voltage generators operate when the signal RASB is in the active cycle, and the generators operate even although the potential of the Vpp is in the logic "high" level in the next cycle by the signal φSPD latched in the previous active cycle. In the next active cycle, the signal φSPD is in the logic "low" level by receiving the status latched in the previous active cycle and the boosting voltage generators are in non-activated states. Although the boosting voltage generators are delayed by one cycle and operate, the Vpp has the large loading characteristics, such that the potential thereof has not received any influence.

One skilled in the art of integrated circuit design and acquainted with the foregoing disclosure will be enabled to construct a number of other circuits that are simple design variations of the specific circuits disclosed. For example, in FIG. 5 the inverter 14 may be dispensed with and the logic complement of φPC may be taken from the output of the inverter 253 shown in FIG. 4. As a further example, in FIG. 7 the NAND gate ND32 may receive delayed φR signal from the output of inverter I23 As a still further example, the FIG. 9 and FIG. 11 circuits can share some logic, allowing the NAND gate ND41 and the inverter I41 to be dispensed with. The claims which follow should be construed to include such embodiments of the invention exhibiting such minor design variations.

What is claimed is:

1. A voltage boosting circuit for a semiconductor memory device comprising:

first circuit means for supplying a chip master clock determining an active state and stand-by state in respective response to first and second states thereof, for generating a detector control signal a first delay time after the first state of said chip master clock is generated, and for generating a latch control signal a second delay time after the first state of said chip master clock is generated, said detector control signal having a first pulse width and said latch control signal having a second pulse width;

second circuit means for responding to said detector control signal and said latch control signal and generating a detecting signal indicative of a current state of a boosting voltage potential;

third circuit means for generating a boosting voltage generator control signal activated in response to said chip master clock and timed to occur simultaneously with said detecting signal; and first and second boosting voltage generating means for generating said boosting voltage potential, respectively operating in said stand-by state and said active state in accordance with said detecting signal and said boosting voltage generator control signal.

2. A boosting voltage circuit of a semiconductor memory device comprising:

first circuit means for supplying a chip master clock determining an active state and stand-by state in respective response to first and second states thereof, for generating a detector control signal a first delay time after the first state of said chip master clock is generated, and for generating a latch control signal a second delay time after the first state of said chip master clock is generated, said detector control signal having a first pulse width and said latch control signal having a second pulse width;

second circuit means for responding to said detector control signal and said latch control signal and generating a first detecting signal indicative of a current state of a boosting voltage potential;

third circuit means responsive to said first detecting signal and generating a second detecting signal in accordance with the control of said chip master clock;

fourth circuit means for generating a boosting voltage generator control signal activated in response to said chip master clock and timed to occur simultaneously with said second detecting signal; and first and second boosting voltage generating means for generating said boosting voltage potential, respectively operating in said stand-by state and said active state in accordance with said detecting signal and said boosting voltage generator control signal.

3. A voltage boosting circuit for a semiconductor memory device comprising:

a clock generator for supplying a chip master clock determining an active state and stand-by state in respective response to first and second states thereof, for generating a detector control signal a first delay time after the first state of said chip master clock is generated, and for generating a latch control signal a second delay time after the first state of said chip master clock is generated, said detector control signal having a first pulse width and said latch control signal having a second pulse width;

a boosting voltage detector for responding to said detector control signal and said latch control signal and generating a detecting signal indicative of a current state of a boosting voltage potential;

first and second boosting voltage generators for generating said boosting voltage potential, respectively operating in said stand-by state and active state in accordance with said detecting signal and delayed said chip master clock signal.

* * * * *